(12) United States Patent
Bergmann et al.

(10) Patent No.: US 6,313,715 B1
(45) Date of Patent: Nov. 6, 2001

(54) SAW DUPLEXER

(75) Inventors: Andreas Bergmann, Haiming; Peter Müller, München, both of (DE)

(73) Assignee: Siemens Matsushita Comp. GmbH & Co. KG, Munich (DE)

( * ) Notice: Subject to any disclaimer, the term of this patent is extended or adjusted under 35 U.S.C. 154(b) by 0 days.

(21) Appl. No.: 09/436,478

(22) Filed: Nov. 8, 1999

Related U.S. Application Data

(63) Continuation of application No. PCT/DE98/01264, filed on May 6, 1998.

(30) Foreign Application Priority Data

May 7, 1997 (DE) .............................. 197 19 467

(51) Int. Cl.[7] .............................. H03H 9/72; H03H 9/64; H03H 9/52
(52) U.S. Cl. .............................. 333/133; 333/193
(58) Field of Search .............................. 333/133, 193–196, 333/132, 134

(56) References Cited

U.S. PATENT DOCUMENTS

| 5,561,406 | * | 10/1996 | Ikata et al. ........................ 333/133 X |
| 5,815,804 | * | 9/1998 | Newell et al. ..................... 333/134 X |
| 5,864,260 | * | 1/1999 | Lee ....................................... 333/133 |
| 6,043,725 | * | 3/2000 | Taguchi et al. ................... 333/132 X |
| 6,057,744 | * | 5/2000 | Ikada .................................. 333/133 |
| 6,115,592 | * | 9/2000 | Ueda et al. .......................... 455/307 |

FOREIGN PATENT DOCUMENTS

| 19514798A1 | 1/1996 | (DE) . |
| 0422637A3 | 4/1991 | (EP) . |
| 0575174A1 | 12/1993 | (EP) . |
| 2-177712 | * 7/1990 | (JP) . |
| 4-16014 | * 1/1992 | (JP) ..................................... 333/133 |
| 07273597 | 10/1995 | (JP) . |

* cited by examiner

Primary Examiner—Robert Pascal
Assistant Examiner—Barbara Summons
(74) Attorney, Agent, or Firm—Herbert L. Lerner; Laurence A. Greenberg; Werner H. Stemer

(57) ABSTRACT

A SAW duplexer having an impedance transformation network in a form of a series capacitance in at least one filter path.

12 Claims, 1 Drawing Sheet

SAW DUPLEXER

CROSS REFERENCE TO RELATED APPLICATION

This is a continuation of copending International Application PCT/DE98/01264, filed May 6, 1998, which designated the United States.

BACKGROUND OF THE INVENTION

Field of the Invention

The present invention relates to a duplexer, more specifically to a surface acoustic wave (SAW) duplexer, which operates with surface acoustic waves.

Such SAW duplexers are known, for example from Published, Non-Prosecuted German Patent Application DE 195 14 798 A1 and from Published, European Patent Application EP 0 422 637 A3.

Duplexers of this generic type are in principle frequency filters, via which different frequency bands can be passed. An exemplary embodiment of such a duplexer is a mobile telephone apparatus, in which a first frequency band, a transmission frequency band, is passed from a circuit configuration which produces it, via a transmission filter, to an antenna, and a reception frequency band which is received via the antenna is passed via a reception filter to a circuit configuration that processes it.

A fundamental problem with the duplexers of this type is the necessity to interconnect two two-port devices to form a three-port device. In the process, the transmission characteristics of the two individual filters, the transmission filter and the reception filter, should be changed as little as possible. Since the filters are normally connected in parallel on the antenna side, it is necessary for the respective other filter to have a high impedance, particularly in the passband of the filters. In the passband, the individual filters are generally matched to 50 W. The impedances of the individual filters in the passband of the respective other filter are considerably different than 50 W.

However, the impedances of the individual filters have to be transformed to the high-impedance area in order that they have a high impedance in the frequency band of the respective other filters, and represent an open circuit in the ideal case. If both individual filters are matched to 50 W, then a specific transformation is required to change the impedance outside the passband without adversely affecting the characteristics in the passband.

Until now, such transformations have been carried out by strip lines. Since SAW filters are generally capacitive outside the passband, the impedance must be shifted through more than 180° until it is large enough and thus has little adverse effect on the other filter. Depending on the dielectric constant of the substrate material, this phase shift can be carried out only by a relatively long strip line. This results in the strip line occupying a large amount of space and having high losses.

SUMMARY OF THE INVENTION

It is accordingly an object of the invention to provide a SAW duplexer that overcomes the above-mentioned disadvantages of the prior art devices of this general type, which has a transformation capability of the type under discussion with a smaller space requirement and lower losses.

With the foregoing and other objects in view there is provided, in accordance with the invention, a surface acoustic wave (SAW) duplexer operating with surface acoustic waves, including a chip, containing:

a transmission path containing a transmission SAW filter having an impedance;

a reception path containing a reception SAW filter having an impedance; and a transformation network having a series capacitance being an interdigital converter disposed in one of the transmission path and the reception path, the transformation network transforming the impedance of one of the transmission SAW filter and the reception SAW filter in a passband of an other of the transmission SAW filter and the reception SAW filter to a high-impedance area.

In accordance with an added feature of the invention, there is an antenna connected to the transmission path and the reception path, and the series capacitance is disposed between the antenna and one of the transmission path and the reception path.

In accordance with an additional feature of the invention, the series capacitance is disposed only in the transmission path.

In accordance with another feature of the invention, the series capacitance is disposed only in the reception path.

In accordance with a further added feature of the invention, the series capacitance is two series capacitances with one of the two series capacitances disposed in the transmission path and the other of the two series capacitances disposed in the reception path.

In accordance with a further additional feature of the invention, the transmission SAW filter has an output side, the series capacitance has a side facing away from the output side of the transmission SAW filter, and including an inductance connected in parallel with the series capacitance on the side facing away from the output side of the transmission SAW filter.

In accordance with yet another feature of the invention, the reception SAW filter has an input side, the series capacitance has a side facing away from the input side of the reception SAW filter, and including an inductance connected in parallel with the series capacitance on the side facing away from the input side of the reception SAW filter.

In accordance with another added feature of the invention, the series capacitance is a chip interdigital converter.

With the foregoing and other objects in view there is further provided, in accordance with the invention, a surface acoustic wave (SAW) duplexer operating with surface acoustic waves including a chip, containing:

a transmission path containing a transmission SAW filter having an impedance;

a reception path containing a reception SAW filter having an impedance;

a first transformation network being an interdigital converter disposed in one of the transmission path and the reception path, the first transformation network transforming the impedance of the one of the transmission SAW filter and the reception SAW filter in a passband of an other of the transmission SAW filter and the reception SAW filter to a high-impedance area; and a second transformation network being a line impedance disposed in the other of the transmission path and the reception path, the second transformation network transforming the impedance of the other of the transmission SAW filter and the reception SAW filter in a passband of the one of the transmission SAW filter and the reception SAW filter to a high-impedance area.

In accordance with an added feature of the invention, the interdigital converter is disposed in the transmission path, and the line impedance is disposed in the reception path.

In accordance with a concomitant feature of the invention, the line impedance is a stripline.

Other features which are considered as characteristic for the invention are set forth in the appended claims.

Although the invention is illustrated and described herein as embodied in a SAW duplexer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
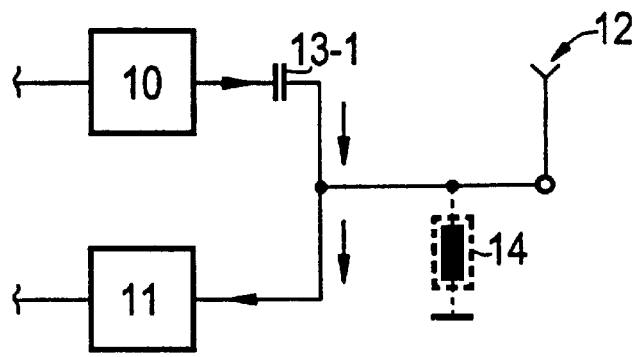
FIGS. 1 to 3 are diagrammatic, block diagrams each showing an embodiment having a transformation network in the form of series capacitances and, it required, inductances according to the invention.

In all the figures of the drawing, sub-features and integral parts that correspond to one another bear the same reference symbol in each case. Referring now to the figures of the drawing in detail and first, particularly, to FIGS. 1–3 thereof. If an impedance transformation is analyzed using the so-called Smith diagram, then it can be seen that the essence of the invention is for the transformation to be carried out by a shift in the mathematically positive direction by at least one series capacitance, rather than in the clockwise direction by use of one line.

Figure 2:
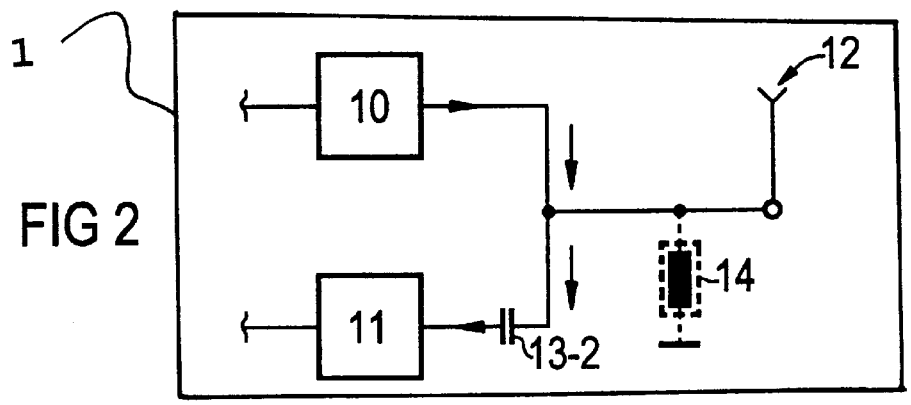
Figure 3:
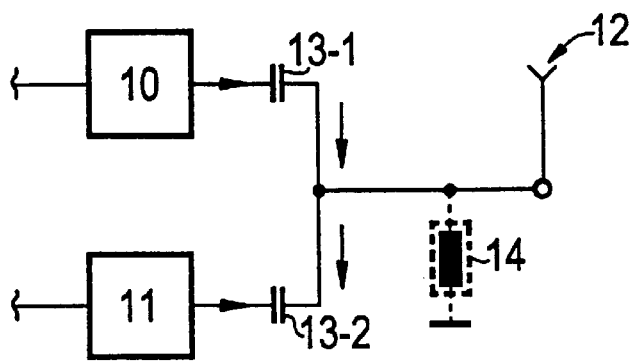

The exemplary embodiments according to FIGS. 1 to 3 correspond to the extent that they all contain a transformation network in the form of at least one series capacitance. In FIGS. 1 to 3, a transmission filter 10 and a reception filter 11 are in each case provided schematically, and are connected in parallel with an antenna 12. The signal propagation directions are in this case indicated by arrows.

According to the invention, a transforming series capacitance 13-1 is now provided in the transmission filter path in the embodiment according to FIG. 1, a transforming series capacitance 13-2 is provided in the reception filter path in the embodiment according to FIG. 2, and both a transforming series capacitance 13-1 in the transmission filter path and a transforming series capacitance 13-2 in the reception filter path are provided in the embodiment according to FIG. 3. In all three embodiments, the transforming series capacitances are located on the antenna side of the duplexer.

If the impedance in the passband upstream of the transformation and of the interconnection of the two filters 10 and 11 is 50 W, then an additional parallel inductance may be helpful. Since this represents a facultative development measure according to the invention, this is indicated in FIGS. 1 to 3 by parallel inductance 14 represented by dashed lines. When considered in the Smith diagram, a transformation is carried out on a concentric circle by the combination of a parallel inductance and at least one series capacitance.

The transformation path is in this case considerably smaller than that of a transformation network using strip line technology.

If the influence of the respective other filter is taken into account as early as the pre-construction stage of the individual filters, then it may be possible to omit the parallel inductance.

The transforming series capacitances 13-1 and 13-2, which are located on the antenna side in series with the filters 10 and 11, can be provided, according to a further embodiment of the invention, by the static capacitances of interdigital converters. The mid-frequency of such interdigital converters must be chosen such that the transfer function of the filters in their passband is not adversely affected. On $LiTaO_3$, 36° rot YX, the mid-frequency of such an interdigital converter must thus be chosen such that it is greater by a factor of at least 1.05 than the mid-frequency of the passband of the series-connected filter.

If chirped converters are used, then this also ensures that these excite a broadband surface acoustic wave for relatively high harmonics, and their Q-factor becomes small. Thus, if the mid-frequency is chosen correctly, converters which represent a very high Q-factor in the area of the passbands of the two filter capacitances can be used to improve the suppression of higher harmonics. Volume waves may also be used to influence the Q-factor in this case.

Figure 4:
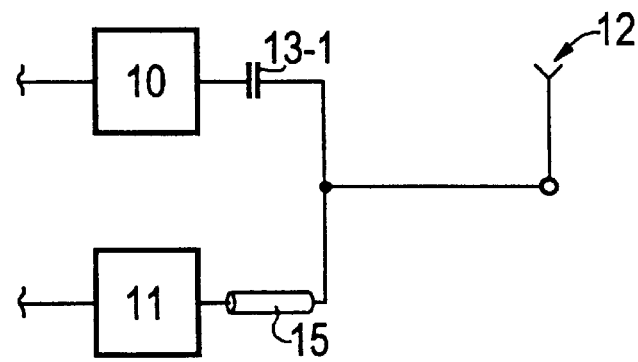
FIG. 4 is a block diagram showing an embodiment having a transformation network with a series capacitance and one line.

If the aim is to achieve good selectivity characteristics in the higher frequency bands, then, if necessary, the greater space requirement for lines may be accepted, and a transformation network may be provided in the form of a series capacitance and a line. Such an embodiment is illustrated in FIG. 4, in which identical elements to those in FIGS. 1 to 3 are provided with the same reference symbols. As can be seen from FIG. 4, a schematically illustrated line 15 is provided in the reception filter path, and this line 15 may be configured as a strip line.

In summary, it can be said that the integrated configuration of the transformation network in the form of series capacitances and lines allows components that can be defined more accurately to be provided.

An inductance corresponding to the inductance 14 in the embodiments according to FIGS. 1 to 3 may be connected discretely to the duplexer, externally.

Finally, it should be mentioned that all the components according to FIGS. 1 to 4 as far as the combination point of the signals can be provided on a chip 1.

We claim:

1. A surface acoustic wave (SAW) duplexer operating with surface acoustic waves, comprising:
   a chip made of lithium tantalate, including:
   a transmission path containing a transmission SAW filter having an impedance;
   a reception path containing a reception SAW filter having an impedance;
   a transformation network having a series capacitance being an interdigital converter disposed in one of said transmission path and said reception path, said interdigital converter having a mid-frequency greater by a factor of at least 1.05 than a mid-frequency of a passband of said one of said transmission SAW filter and said reception SAW filter switched in series, said transformation network transforming said impedance of one of said transmission SAW filter and said reception SAW filter in a passband of the other of said transmission SAW filter and said reception SAW filter to a high-impedance area; and an antenna connected to said transmission path and said reception path, and said series capacitance disposed between said antenna and one of said transmission path and said reception path.

2. The SAW duplexer according to claim 1, wherein said interdigital converter is a chirped converter.

3. The SAW duplexer according to claim 1, wherein said series capacitance is disposed only in said transmission path.

4. The SAW duplexer according to claim 3, wherein said transmission SAW filter has an output side, said series capacitance has a side facing away from said output side of said transmission SAW filter, and including an inductance connected in parallel with said series capacitance on said side facing away from said output side of said transmission SAW filter.

5. The SAW duplexer according to claim 1, wherein said series capacitance is two series capacitances with one of said two series capacitances disposed in said transmission path and the other of said two series capacitances disposed in said reception path.

6. The SAW duplexer according to claim 1, wherein said series capacitance is disposed only in said reception path.

7. The SAW duplexer according to claim 6, wherein said reception SAW filter has an input side, said series capacitance has a side facing away from said input side of said reception SAW filter, and including an inductance connected in parallel with said series capacitance on said side facing away from said input side of said reception SAW filter.

8. The SAW duplexer according to claim 1, wherein said series capacitance is a chip interdigital converter.

9. A surface acoustic wave (SAW) duplexer operating with surface acoustic waves, comprising:
a chip, including:
a transmission path containing a transmission SAW filter having an impedance;
a reception path containing a reception SAW filter having an impedance;
a first transformation network being an interdigital converter disposed in one of said transmission path and said reception path, said interdigital converter having a mid-frequency greater by a factor of at least 1.05 than a mid-frequency of a passband of said one of said transmission SAW filter and said reception SAW filter switched in series, said first transformation network transforming said impedance of said one of said transmission SAW filter and said reception SAW filter in a passband of the other of said transmission SAW filter and said reception SAW filter to a high-impedance area;
a second transformation network being a line impedance disposed in said other of said transmission path and said reception path, said second transformation network transforming said impedance of said other of said transmission SAW filter and said reception SAW filter in a passband of said one of said transmission SAW filter and said reception SAW filter to a high-impedance area; and
an antenna connected to said transmission path and said reception path, and said first transformation network disposed between said antenna and one of said transmission path and said reception path and said second transformation network disposed between said antenna and said other one of said transmission path and said reception path.

10. The SAW duplexer according to claim 9, wherein said interdigital converter is disposed in said transmission path, and said line impedance is disposed in said reception path.

11. The SAW duplexer according to claim 9, wherein said line impedance is a stripline.

12. The SAW duplexer according to claim 9, wherein said interdigital converter is a chirped converter.

* * * * *